United States Patent

Schmidt

[11] Patent Number: 5,200,363
[45] Date of Patent: Apr. 6, 1993

[54] METHOD FOR MANUFACTURING A SEMICONDUCTOR PACKAGE INCLUDING A GLASS SUPPORT

[75] Inventor: Steffen Schmidt, Reutlingen, Fed. Rep. of Germany

[73] Assignee: Robert Bosch GmbH, Stuttgart, Fed. Rep. of Germany

[21] Appl. No.: 830,205

[22] Filed: Nov. 20, 1991

[30] Foreign Application Priority Data

Dec. 20, 1990 [DE] Fed. Rep. of Germany ....... 4040821

[51] Int. Cl.$^5$ .................... H01L 21/52; H01L 21/58; H01L 21/60
[52] U.S. Cl. ..................... 437/208; 437/215; 437/218; 437/221; 437/915; 29/837; 29/845
[58] Field of Search ............... 437/208, 215, 218, 221, 437/233, 915; 361/414, 419; 29/837, 840, 845, 884; 73/777; 174/52.4

[56] References Cited

U.S. PATENT DOCUMENTS

| | | | |
|---|---|---|---|
| 3,021,461 | 2/1962 | Oakes et al. ........................ | 437/223 |
| 3,370,203 | 2/1968 | Kravitz et al. ...................... | 437/208 |
| 3,605,062 | 9/1971 | Tinkelenberg et al. ........... | 174/52.4 |
| 4,750,092 | 6/1988 | Werther ............................... | 361/400 |
| 4,868,638 | 9/1989 | Hirata .................................. | 357/72 |
| 4,951,510 | 8/1990 | Holm-Kennedy et al. ....... | 73/862.04 |

*Primary Examiner*—Olik Chaudhuri
*Assistant Examiner*—David E. Graybill
*Attorney, Agent, or Firm*—Frishauf, Holtz, Goodman & Woodward

[57] ABSTRACT

An electronic component with at least one silicon chip is proposed, where the silicon chip is provided with electronic switching elements on at least one main surface. The silicon chip is bonded to a glass support with its main surface provided with the electronic switching elements and forms a unit together with it, which is applied to a housing having connector pins for the electrical contact with the silicon chip. The glass support has through-bores in the same modular pattern as the connector pins of the housing, into which the connector pins extend. The through-bores in the glass support are filled with conductive paste, so that the electrical contact between the silicon chip and the connector pins is provided by the conductive paste.

2 Claims, 1 Drawing Sheet

METHOD FOR MANUFACTURING A SEMICONDUCTOR PACKAGE INCLUDING A GLASS SUPPORT

CROSS-REFERENCE TO RELATED PATENTS AND APPLICATIONS, ASSIGNED TO THE ASSIGNEE OF THE PRESENT INVENTION, THE DISCLOSURES OF WHICH ARE HEREBY INCORPORATED BY REFERENCE

U.S. Pat. Nos. 4,522,067 and 4,620,365, BURGER.

U.S. Pat. No. 5,005,414, HOLLAND et al. (=DE-OS 38 14 950)

U.S. Pat. No. 4,955,234, MAREK, issued Sept. 11, 1990=DE 38 14 952;

ENGELSDORF & METTNER, German Patent Disclosure DE-OS 39 19 876, publ. Dec. 20, 1990, and corresponding PCT/DE90/00366, publ Dec. 27, 1990 as WO 90-15933;

U.S. Ser. No. 07/ 566,997, METTNER et al., filed Aug. 13, 1990, now U.S. Pat. No. 5,142,781, and corresponding PCT/EP90/01297, publ. as WO 91-02169;

German Patent Disclosure DE 40 16 472.1 and corresponding U.S. Ser. No. 07/701,880, BANTIEN, filed May 17, 1991;

German Patent Disclosure DE 40 16 471.3 and corresponding U.S. Ser. No. 07/701,781, BANTIEN, filed May 17, 1991, German Patent Disclosure DE 40 28 556.1 and corresponding U.S. Ser. No. 07/ 756,490, GERSTNER, filed Sept. 9, 1991;

German Patent Application P 40 22 495.3, filed July 1990; No known English equivalent;

German Patent Disclosure DE 40 28 402.6 and corresponding U.S. Ser. No. 07/ 750,893, MAREK & SEIPLER, filed Aug. 26, 1991;

German Patent Disclosure DE 40 41 582.1 and corresponding U.S. Ser. No. 07/800,976, ROTHLEY, WOLF & ZABLER, filed Dec. 2, 1991;

CROSS-REFERENCE TO OTHER RELATED PATENTS

U.S. Pat. No. 4,581,624, O'CONNER/ALLIED, 8 APR. 1986, entitled MICROMINIATURE SEMICONDUCTOR VALVE;

U.S. Pat. No. 4,836,023, OIKAWA/YAZAKI CORP., 6 JUN. 1989, entitled VIBRATIONAL ANGULAR RATE SENSOR;

U.S. Pat. No. 4,549,926 and 4,578,142, CORBOY JR. et al/RCA;

U.S. Pat. No. 4,585,513, GALE et al/RCA, issued 29 APR. 1986;

U.S. Pat. No. 4,658,495, FLATLEY & IPRI/RCA, issued 21 APR. 1987;

U.S. Pat. No. 4,698,132, DENNIS/RCA, issued 6 OCT. 1987;

German Patent DE-PS 36 25 411, SEIDEL, 11 NOV. 1988, assigned to Messerschmidt-Bökow-Blohm GmbH.

CROSS-REFERENCE TO RELATED LITERATURE

Walter Kern, "Chemical Etching of Silicon, Germanium, Gallium Arsenide, and Gallium Phosphide", RCA REVIEW, June 1978, Vol. 39, pp. 278–308.

W. C. Tang et al., "Laterally Driven Polysilicon Resonant Microstructures", Vol. 20, Sensors & Actuators, pages 53–59, IEEE 1989.

FIELD OF THE INVENTION

The invention relates to an electronic component with at least one silicon chip which is provided on at least one main surface with electronic switching elements and is bonded to a glass support used as the connecting layer, where the at least one silicon chip forms a unit together with the glass support, which unit is mounted on a housing provided with connector pins for the electrical connection of the silicon chip. The invention further relates to a method for constructing such an electronic component.

BACKGROUND

It is known to construct electronic components with a silicon chip provided with electronic switching elements on a main surface in such a way that the silicon chip is anodically bonded to a glass support, and to apply this unit constituted of the silicon chip and the glass support on a housing provided with connector pins for the electrical connection of the silicon chip. The electrical connection between the silicon chip and the connector pins is provided by means of bonding wires, which requires a method step in the construction of the electrical component.

THE INVENTION

In contrast to the above, the electronic component according to the invention has the advantage that the step of wire bonding is omitted in its production. It is furthermore advantageous that with the structure of the component according to the invention the main surface of the silicon chip provided with electronic switching elements is hermetically sealed against exterior effects, in particular attacks of aggressive media.

It is also advantageous that the exactly adjusted mounting of the glass support or the silicon chip on the housing is made possible by means of the through-bores applied to the glass support in the same modular pattern as the connector pins of the housing Filling the holes with a conductive paste represents a simple way of handling the electrical contact between the silicon chip and the connector pins of the housing.

The structure of the electrical component in accordance with the invention is particularly advantageous in connection with silicon chips with micro-mechanical structural elements. For example, the structure of the component has shown to be particularly advantageous for pressure measurements by means of silicon chips, out of which a micro-mechanical diaphragm has been structured and on which resistors have been applied to the main surface of the silicon sensor chip at the points of maximum stretching of the outer areas of the diaphragm. Not only is the active sensor side hermetically sealed by face down mounting of the sensor chip, but it is additionally of advantage in that the pressure effect takes place in such a way that all connections (sensor chip - glass support - metal housing) are evenly charged with the pressure forces. Therefore separation of the sensor chip from the housing is impossible, in particular in the higher pressure ranges. A further advantage of this structure lies in that it is possible to provide an overload protection for the pressure sensor by means of the special construction of the glass support in the area of the sensor diaphragm.

DRAWINGS

FIG. 1 shows the structure of an electronic component for pressure measurement in accordance with the invention, and FIG. 2 shows, in contrast thereto, the structure of an electronic component for pressure measurement in accordance with prior art technology.

DETAILED DESCRIPTION

Figure 1:
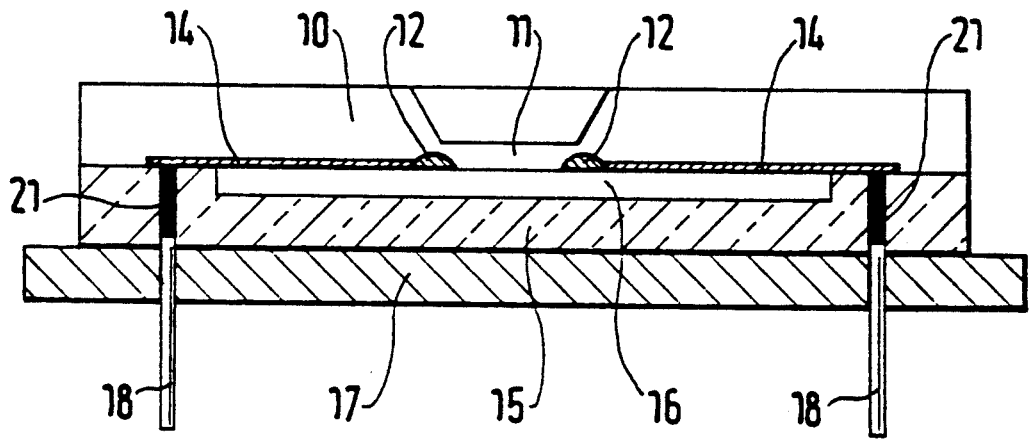

In FIG. 1 the reference numeral 10 identifies a sensor chip made from monocrystalline silicon. A diaphragm 11 has been structured out of the sensor chip 10. Sensor resistors are placed in the outer areas of the diaphragm 11, for example by diffusion, into the surface of the sensor chip 10 out of which the diaphragm 11 is formed. Strip conductors 14, leading away from the sensor resistors 12, are disposed on the main surface for contacting the sensor resistors 12. The strip conductors may also be diffused into the main surface or they may be vacuum-evaporated or sputtered on the main surface. The sensor chip 10 is bonded with its main surface to a glass support 15 preferably consisting of "PYREX(R)" glass. A recess 16 has been cut from the glass support 15 in the area of the diaphragm 11. In addition, the glass support 15 has though-bores, which are filled with a conducting paste 21, preferably a conducting silver paste, in the area facing the sensor chip 10. The glass support 15 has been applied to a housing 17, preferably a metal housing, which is provided with connector pins 18 for the electrical connection with the sensor chip 10. The through-bores in the glass support 15 are arranged in such a way that the connector pins 18 of the metal housing 17 extend into the through-bores. The strip conductors 14 on the main surface of the sensor chip 10 are disposed in such a way that, together with the conductive paste 21 in the through-bores in the glass support 15, they provide an electrical connection between the sensor resistors 12 and the connector pins 18 of the metal housing 17.

The direction of pressure is from top to bottom in the electronic component for pressure measurement illustrated in FIG. 1. In this case the diaphragm 11 of the sensor chip 10 is displaced vertically towards the glass support, which is also made possible in the direction toward the glass support 15 because of the recess 16. Depending on the depth of the recess 16, the glass support 15 can also be used as overload protection for the sensor chip 10. The active side of the sensor chip, i.e. the main surface in which micro-mechanical elements have been formed and on which electronic switching elements and strip conductors are disposed, is sealed hermetically against exterior effects and in this way protected from attacks by aggressive media, such as occur when it is used in motor vehicles. Because of the particular disposition (face down) of the sensor chip, separation of the sensor chip from the housing is impossible even with higher pressure effects. In the structure of an electronic component shown in FIG. 1 the electrical connection between the silicon chip and the housing connector pins is provided by means of a conductive paste, i.e. no extensive bonding process is required.

Figure 2:
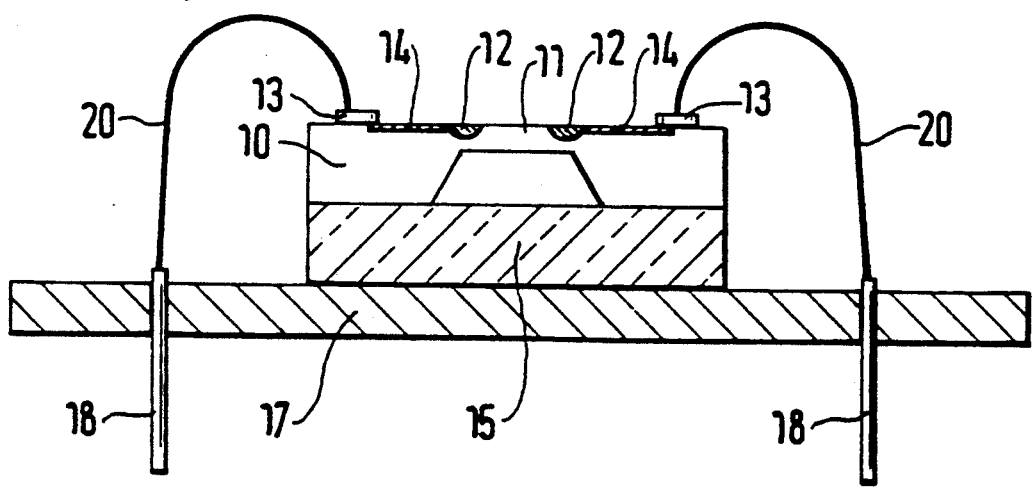

FIG. 2 shows the structure of an electronic component for pressure measurement in accordance with the state of the art and corresponding to the structure of the electronic component shown in FIG. 1. A sensor chip 10 with a diaphragm 11, sensor resistors 12 and strip conductor 14 is bonded with its passive side to a glass support 15. The glass support 15 is applied to a metal housing 17 having connector pins 18, for example by gluing or soldering. In this case, the connection between the sensor chip 10 and the connector pins 18 of the metal housing 17 is provided by means of bonding wires 20, which originate on bond pads 13 disposed on the sensor chip 10, the strip conductors 14 being arranged in such a way that they provide a connection between the sensor resistors 12 and the bond pads 13. This construction requires, in contrast to the structure illustrated in FIG. 1, an additional process step for the wire bond. Furthermore, the active portions of the sensor chip, i.e. the diaphragm, the sensor resistors, the strip conductors and the electrical connections between the sensor chip and the connector pins of the metal housing are exposed to external influence, because of which the breakdown tendency of the component is considerably increased.

I claim:

1. A method for constructing an electronic component with at least one silicon chip which is provided on at least one main surface with electronic switching elements, characterized in that a housing (17) having a pattern of connector pins (18) is provided, through-bores are provided in a glass support (15) in the same pattern as the connector pins (18) of the housing (17), the silicon chip (10) is bonded to the glass support (15) with its main surface equipped with electronic switching elements (12, 14), a conductive paste (21) is inserted into the through-bores, and the glass support (15), together with the silicon chip (10) is applied to the housing (17) in such a way that the connector pins (18) extend into the through-bores.

2. A method for constructing an electronic component in accordance with claim 1, characterized in that a micro-mechanical diaphragm (11) is structured out of the silicon chip (10), resistors are applied to the main surface of the silicon chip (10) at the points of maximum stretching in the outer areas of the diaphragm (11), strip conductors (14) are applied to the main surface of the silicon chip (10) for contacting the resistors (12), and a recess is cut into the surface of the glass support (15) in the area of the diaphragm (11), on which the silicon chip (10) is bonded.

* * * * *